United States Patent
Uzoh et al.

(10) Patent No.: US 7,195,700 B2
(45) Date of Patent: Mar. 27, 2007

(54) METHOD OF ELECTROPLATING COPPER LAYERS WITH FLAT TOPOGRAPHY

(75) Inventors: Cyprian E. Uzoh, San Jose, CA (US); Serdar Aksu, Mountain View, CA (US); Bulent M. Basol, Manhattan Beach, CA (US)

(73) Assignee: Novellus Systems, Inc., San Jose, CA (US)

( * ) Notice: Subject to any disclaimer, the term of this patent is extended or adjusted under 35 U.S.C. 154(b) by 117 days.

(21) Appl. No.: 10/769,605

(22) Filed: Jan. 30, 2004

(65) Prior Publication Data

US 2004/0265562 A1 Dec. 30, 2004

Related U.S. Application Data

(60) Provisional application No. 60/444,355, filed on Jan. 30, 2003.

(51) Int. Cl.
*C25D 5/18* (2006.01)
(52) U.S. Cl. .............................. 205/104; 257/E21.583; 257/E21.175
(58) Field of Classification Search ............... 205/104; 257/E21.175, E21.583
See application file for complete search history.

(56) References Cited

U.S. PATENT DOCUMENTS

| | | | |
|---|---|---|---|
| 5,972,192 A * | 10/1999 | Dubin et al. ............... 205/101 |
| 6,110,346 A | 8/2000 | Reid et al. | |
| 6,432,821 B1 | 8/2002 | Dubin et al. | |
| 2002/0061715 A1 * | 5/2002 | Uzoh et al. ................ 451/41 |

* cited by examiner

*Primary Examiner*—Roy V. King
*Assistant Examiner*—Nicholas A. Smith
(74) *Attorney, Agent, or Firm*—Knobbe Martens Olson & Bear LLP

(57) ABSTRACT

A method of electrochemically filling features on a wafer surface to form a substantially planar copper layer is provided. The features to be filled includes a first feature that is an unfilled feature with the smallest width and a second feature having the next larger width after the smallest feature. The first and the second features are less than 10 micrometers in width. The method comprises applying a first cathodic current to form a first copper layer on the wafer surface. The first copper layer has a planar portion over a first feature and a non-planar portion over a second feature. After a surface of the first copper layer is treated by applying a first pulsed current, a second cathodic current is applied to form a second copper layer on the first copper layer. The second copper layer has a planar portion over both the first and second features.

24 Claims, 2 Drawing Sheets

US 7,195,700 B2

METHOD OF ELECTROPLATING COPPER LAYERS WITH FLAT TOPOGRAPHY

RELATED APPLICATIONS

This application claims priority to U.S. Prov. No. 60/444,355 filed Jan. 30, 2003 (NT-290-P), which is incorporated herein by reference.

FIELD

The present invention generally relates to semiconductor integrated circuit manufacturing, and more particularly to a method for electroplating copper on a semiconductor wafer to form copper interconnects.

BACKGROUND

Modern integrated circuits contain millions of devices to achieve complex functions. The electrical connection between the devices in such semiconductor circuits is provided by fine wires of conductive metals known as interconnects. As integrated circuit chips have become larger and more complex the requirements placed on the interconnect systems have also increased. As a result, interconnects have evolved from a single layer of aluminum to several levels of metal interconnects extending in channels formed horizontally and vertically in the body of the chip. In the multilevel metallization scheme insulating interlayer dielectric layers separate the silicon or local interconnect lines from each other. The linkage from one layer of interconnect to another is provided by vias, which are opened in the interlayer dielectric layers and then filled by metal.

Because of several advantages, copper has recently become the preferred metal of interconnect applications, replacing aluminum and its alloys. The preferred method of forming copper interconnects is the damascene process. In the damascene method, copper is generally deposited using electroplating processes onto a dielectric diffusion layer previously deposited into vias and trenches that are previously etched in the interlayer dielectric. Chemical mechanical planarization (CMP) is then used to planarize the deposited copper layer, barrier layer and even the interlayer dielectric following the copper deposition.

FIG. 1 schematically shows exemplary arrays of features that are formed in the dielectric layer 10 on an exemplary semiconductor substrate. These features need to be filled by electroplated copper to form copper interconnects. As an example, a first array 11 of features may be sub-micron size trenches with widths in the range of 0.05–0.5 microns. A second array 12 of features may be trenches with widths in the range of 0.5–2 microns. A third array 13 of features may be trenches with widths in the range of 2–5 microns. Before electroplating, barrier and seed layers are deposited over the whole surface and into the arrays 11, 12 and 13 of the substrate as is well known in the field. Such layers will not be shown in FIG. 1 for clarification purpose.

Electroplating solutions typically contain organic additives such as accelerators, suppressors and levelers in their formulations. Commonly used electrolytes are copper sulfate solutions supplied by companies such as Enthone and Shipley. The additives in the plating solutions help provide smooth deposits and bottom up growth in small features.

FIG. 2 shows the typical evolution of copper thickness profiles A, B, C and D over the substrate surface depicted in FIG. 1, when electrodeposition is carried out from electrolytes containing accelerator and suppressor species. As the plating is initiated by applying a cathodic voltage to the wafer with respect to an anode, copper first starts to deposit conformally. Then bottom-up growth is initiated and the first array 11 of the smallest features is quickly filled, for example at time $T_1$. Thickness profile at time $T_1$ is represented by profile A. As can be seen from FIG. 2, at time $T_1$ the larger features are still not fully filled with copper. Deposition is then continued to fill the larger features. Thickness profile B represents the copper profile at a time $T_2$ when the second array 12 of features is completely filled by copper. As the second array 12 is filled however, the accelerator species that are responsible for bottom-up fill of the features cause a bump or overfill 20 over the first array 11. The reason for this phenomenon is believed to be the high accelerator concentration that stays over the first array 11, even after the fill is complete. Similarly, thickness profile C shows that as the third array is completely filled another bump is formed, this time over the second array 12. If plating is continued, eventually a third bump may also be formed over the third array 13 as shown in profile D.

Non-flat profile depicted as profile D in FIG. 2 presents challenges for the CMP process. During CMP, surface of dense arrays that are overfilled need to be cleared off copper to avoid shorting between the features. This requires over-polishing, which in turn causes dishing and erosion defects as well known in the art. It should be noted that the bumps may have a copper thickness of more than 2000 Å (for example 2000–6000 Å) compared to the region of the wafer where there are isolated large features. A flat copper thickness profile is therefore preferred for the best results after the CMP step of the interconnect fabrication process. In some prior art applications, levelers may be used to minimize bump formation over the dense arrays. However, levelers cannot completely eliminate the bump formation problems.

Defect-free filling of the small features is another requirement for interconnect fabrication. Copper deposited into the vias and trenches needs to be free of voids, seams and other defects to avoid high resistance and reliability problems. Plating solutions with bottom-up filling capability are formulated to minimize such defects. In addition to the formulation of the bath, plating waveform which is the voltage/current applied to the wafer is also an important factor in minimizing or eliminating fill-related defects. For example, in the prior art, applying reverse pulses (anodic pulses) to the wafer during early stages of the plating period is shown to improve filling properties of the smallest features. Example of such prior art processes may be seen in U.S. Pat. Nos. 5,972,192, 6,297,155 and 6,303,014. Generally, reverse pulses used in the prior art are applied in short time durations in millisecond level. Further, prior art reverse pulses are either applied during the gap file period or throughout the plating period.

SUMMARY

A method is developed to control the planarity of the copper or copper alloy deposition over a semiconductor substrate with features of various sizes and densities. In this method, the plating potential is reversed multiple times with different durations and waveforms to prevent excessive deposition of copper over small features. In the absence of potential reversal, the growth rate of film over small features is very fast due to the accumulation of accelerator species at high concentrations following the bottom-up fill. Reversing the plating potential at carefully selected intervals reduces the growth rate over such features. In the present method, each potential reversal period is aimed at prevention of bump formation at a specific feature size and is applied when the bottom-up fill is nearly completed at that feature size.

In one aspect of the present invention, a method of electrochemically filling cavities on a wafer surface to form a substantially planar conductive layer is provided. During the process, initially, a first cathodic current is applied to form a first conductive layer on the wafer surface. The first conductive layer includes a planar portion over a first cavity and a non-planar portion over a second cavity. The first cavity is an unfilled cavity with the smallest width and the second cavity has the next larger width after the smallest cavity. The first and the second cavities are less than 10 micrometers in width. In the next step of the process, surface of the first conductive layer is treated by applying a first pulsed current. In the following step, a second cathodic current is applied to form a second conductive layer on the first conductive layer. The second conductive layer has a planar portion over both the first and second cavities. The steps of treating and applying is repeated until all of the cavities are filled.

These and other features and advantages of the present invention will be described below with reference to the associated drawings.

DETAILED DESCRIPTION

The microscopic and macroscopic uniformity of copper film after electrodeposition step is critical for the performance of CMP to efficiently polish copper from the whole wafer without excessive overpolish. The present invention is aimed at controlling the growth rate of copper deposition over the high density feature areas by applying a series of reversed potential pulse sequences to eliminate or reduce microscopic thickness non-uniformities over the dense array of small features. By selecting an optimized reverse potential pulse sequence, bump formation, which is defined in the background section, could be eliminated or minimized over the features narrower than about 10 microns, preferably narrower than 5 microns and therefore the micro-scale planarity of the film could be highly improved.

Figure 1:
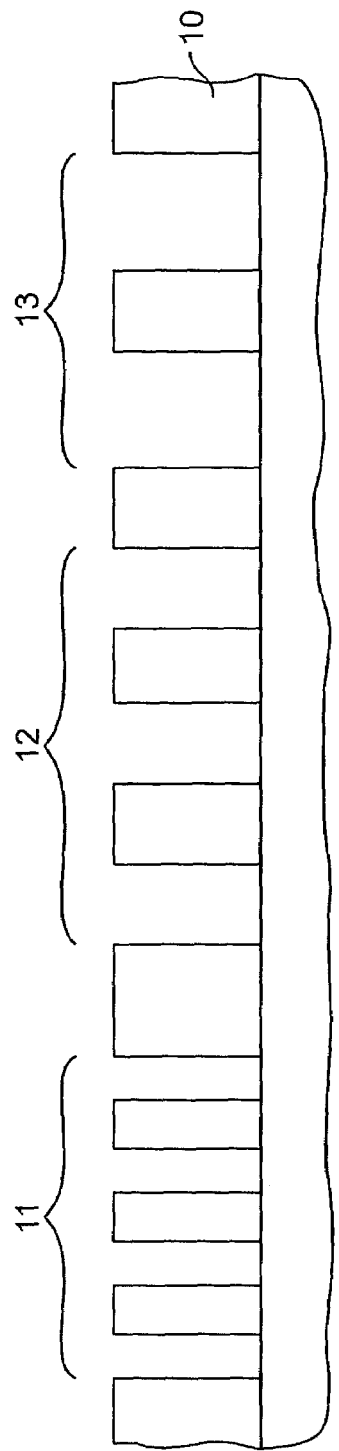
FIG. 1 is a schematic illustration of arrays of features that are formed on a semiconductor substrate.
Figure 2:
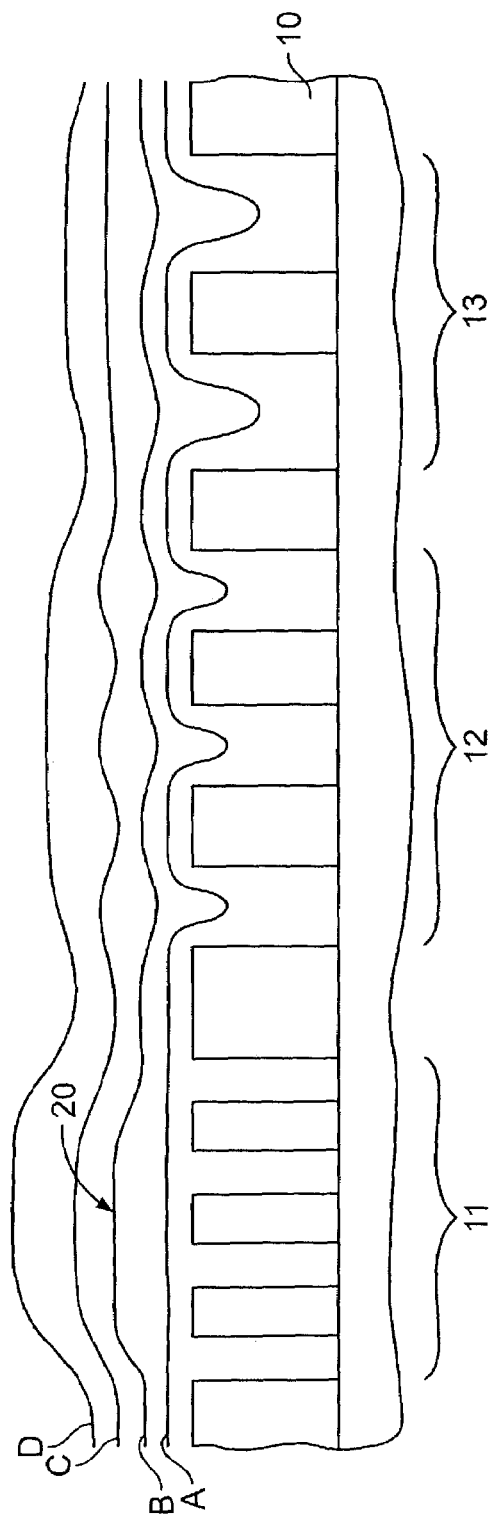
FIG. 2 is a schematic illustration of stages of prior art copper deposition over the substrate shown in FIG. 1.
Figure 3:
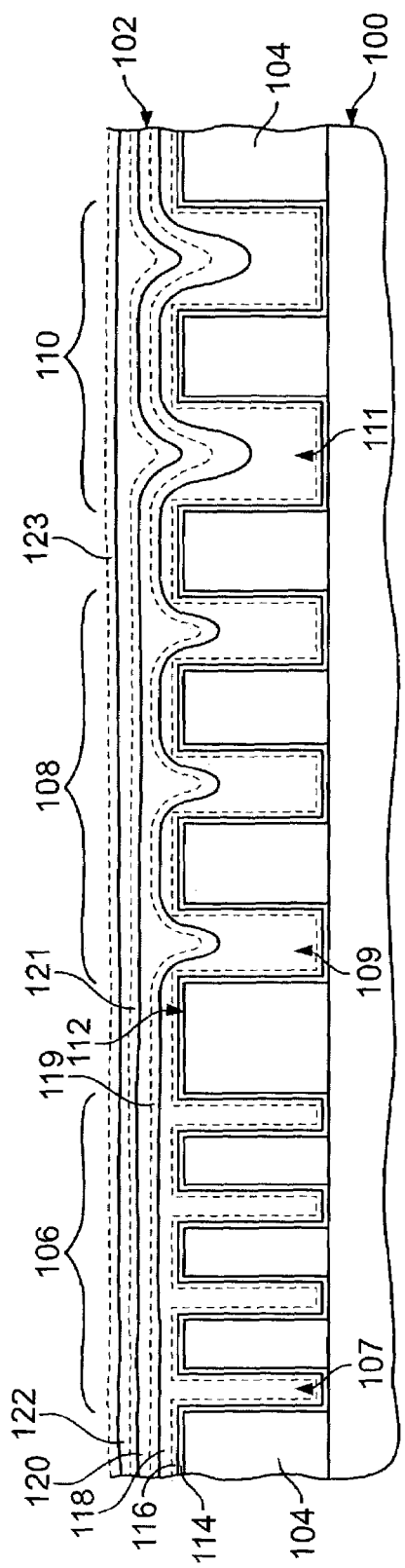
FIG. 3 is a schematic illustration of a substrate having arrays of features that are filled with the process of the present invention.

FIG. 3 illustrates a substrate 100 having a copper layer 102 deposited in accordance with the principles of the present invention. The substrate 100 is a semiconductor substrate, preferably silicon, comprising an insulating layer 104 such as a dielectric layer, for example $SiO_2$, on top of it. The dielectric layer 104 is previously patterned and processed with known semiconductor process technologies to form exemplary first, second and third feature or cavity arrays 106, 108 and 110. Accordingly, the first, second and third feature arrays are comprised of small width (about 0.05–0.5 microns) or small, medium width (about 0.5–2 microns) or medium and large width (2–5 microns) or large trenches 107, 109 and 111, respectively. The trenches 107, 109 and 111 and surface 112 of the dielectric layer 104 are lined with a barrier layer 114, for example Ta or TaN or both, and a copper seed layer 116 on top of the barrier layer. It is understood that the substrate 100, the layers on top it and the way they are processed are the same as the substrate shown in FIG. 1. However, in order to describe the present invention in detail and more clearly, different reference numerals are used.

Figure 4:
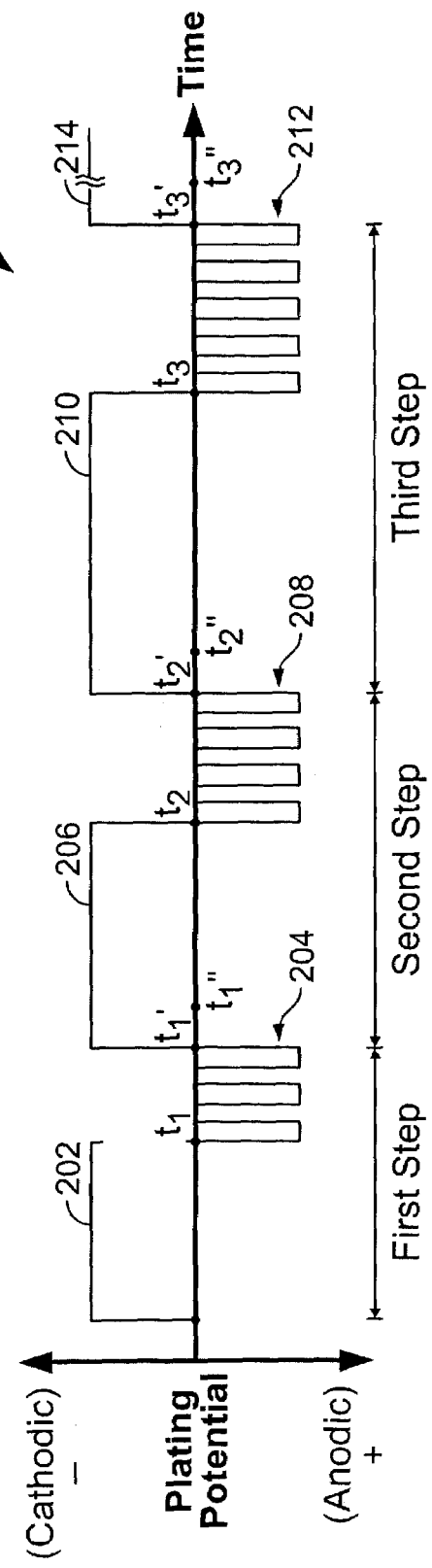
FIG. 4 is a graph showing wave-forms used during the various stages of the electrochemical deposition process of the present invention.

The electrodeposition process of the present invention will be described in connection with FIGS. 3 and 4. The graph 200 in FIG. 4 shows an exemplary electric field waveform used in the present invention. Referring to FIG. 3, the electrochemical deposition of the copper layer 102 may be described using a multi-step selective filling process that fills each feature group in predetermined time intervals. After filling of the features that are approximately less than 5–10 microns in width with the process of the present invention, the process may proceed with a selected conventional electroplating process to fill the features having more than 10 microns feature widths. Of course, although the exemplary process of the present invention has three process steps, depending on the number of feature array groups of interest, the process may have multiple process steps to fill features grouped according to their sizes.

The electrodeposition is carried out from a copper ion containing plating or electrolyte solution having accelerator and suppressor species. The electrolyte solution may not include levelers, although their inclusion does not affect the process of the present invention. During the process, either the substrate is immersed in the electrolyte, or the seed layer lined surface of the substrate is contacted with the electrolyte. An electrode is also immersed in the electrolyte, and the substrate to be plated and the electrode are connected to a power supply that is able to apply a voltage, or able to reverse or pulsate the voltage, between the electrode and the substrate. During the electroplating process, the electrode functions as an anode while the conductive substrate surface becomes cathode.

Accordingly, in a first exemplary process step, a first copper layer 118 is deposited over the substrate to completely fill the small trenches 107 in the array 106. As shown in FIGS. 3 and 4, the plating is initiated by applying a cathodic voltage to the substrate with respect to the electrode (not shown). During the process, copper first starts to deposit conformally, and then bottom-up growth is initiated and the small trenches 107 are quickly filled by the time $t_1$. As shown in FIG. 4, this stage of the process comprises a first cathodic waveform 202. The waveform may be a rectangular DC wave form as shown in FIG. 4, however, any waveform, DC or AC or varying may be used to fill the features. It should be understood that the prior art defect-free filling of the small features that is mentioned in the background section is carried out before the time $t_1$. Therefore, the prior art does not address the bump formation problem, which occurs after the time $t_1$.

Time $t_1$ is a predetermined filling time and depends on the width of the trench. Once the small trenches 107 are filled with the layer 118, a first set of anodic pulses 204 are applied until a predetermined time $t_1'$. The set of pulses may comprise at least one pulse of 0.5 to 5 seconds in duration, preferably 1 to 2 seconds. The application of pulsed waveform 204 prevents bump formation over the layer 118 above the array 106 when the deposition is continued. As mentioned before, in the prior art applications, the accelerator species that are responsible for bottom-up fill of the features can cause a bump or overfill over the small trenches, as the deposition progresses after the filling of the smaller features. In the present invention, use of pulsed wave forms advantageously reduce accelerator concentrations over the deposited layer and hence inhibit bump formation, when the deposition process continues. Although the pulses shown in FIG. 4 are preferably completely anodic, it is also possible to have cathodic components of these pulses.

After the application of pulsed waveform 204, in a second step of the process, a first leveled deposition layer 119 is initially formed on the copper layer 118. In this step, a second cathodic wave form 206 is applied to initiate deposition of the layer 119 over the first layer 118 which is treated with pulsed wave 204 to assure flatness of the subsequently deposited layer 119. As shown in FIG. 4, the second cathodic waveform 206 is applied between the time $t_1'$ and the time $t_2$, and the first leveled deposition layer 119 is formed between time $t_1'$ and $t_1''$. As can be seen from FIG. 3, at time $t_1''$, although the small trenches are filled and successfully covered with the first leveled deposition layer 119, which is bump free and flat, the medium and larger trenches are still not fully filled with copper. Deposition is then continued with the waveform 206 to fill the medium trenches 109 with a second copper layer 120.

During the deposition of the second copper layer 120 on the layer 119, between time $t_1 41$ and $t_2$, copper starts filling the remaining unfilled upper portions of the medium trenches and large trenches, and by the time $t_2$, the medium trenches 109 are completely filled. Once the medium trenches 109 are filled, the second step of the process is continued by applying a second set of anodic pulses 208 to treat the second copper layer 120 until a predetermined time $t_2'$. As in the previous step, the application of pulsed waveform 208 prevents bump formation on the layer 120 over the array 108 when the plating continues with deposition of a new copper layer on top of the layer 120.

After the application of pulsed wave form 208, in a third step of the process, a second leveled deposition layer 121 is formed over the second layer 120, as a third cathodic wave form 210 is applied to initiate copper deposition over the second layer 120 which is pulsed wave treated. As shown in FIG. 4, plating process comprises application of a third cathodic waveform 210 between the time $t_2'$ and the time $t_3$. In particular, the second leveled deposition layer 121 is formed between time $t_2'$ and $t_2''$ over the pulsed wave treated copper layer 120. As can be seen from FIGS. 3 and 4, at time $t_2''$, although the second leveled deposition layer 121, which is flat, is formed over the small and medium arrays 106 and 108, the large trenches 111 in large array 110 are still not fully filled with copper. The third process step is then continued with deposition of a third copper layer 122 over the second leveled layer 121 to completely fill the large trenches 111. As shown in FIG. 4, this stage of the process is performed within the third cathodic waveform 210 between the time $t_2''$ and the time $t_3$.

During the deposition of the third copper layer 122, between time $t_2''$ and $t_3$, copper starts filling the remaining unfilled upper portions of the large trenches and by the time $t_3$, the large trenches 111 are completely filled. Once the large trenches 111 are filled, the third step of the process is continued by applying a third set of anodic pulses 212 until a predetermined time $t_3'$. As in the previous steps, the application of pulsed waveform 212 prevents bump formation on the layer 122 when the plating continues with deposition of a new copper layer on top of the layer 122.

Up to this point of the process of the present invention fills the features that are approximately less than 10 microns in width. The process proceeds with the conventional electroplating process to fill the features having more than 10 microns feature widths so that after the application of pulsed waves, a third leveled deposition layer 123 over the layer 122 may be formed to continue deposition process. The third leveled deposition layer 123 may be formed by the time $t_3''$ using for example a fourth cathodic waveform 214. In all above steps of the present invention, time spent to fill feature arrays 106, 108 and 110 using forward cathodic waveform depends on the size of the features. Further, it is understood that although the waveforms 202, 206 and 210 are DC waveforms with equal magnitude, this is not necessary to perform the process of the present invention. The process can be performed using any DC or AC waveform having different magnitudes. As a result of electroplating process of the present invention, the copper layer 102 is formed over the feature arrays 106, 108 and 110, which have approximately less than 10 microns width or preferably less than 5 microns width, in a planar manner without bumps.

Although various preferred embodiments have been described in detail above, those skilled in the art will readily appreciate that many modifications of the exemplary embodiment are possible without materially departing from the novel teachings and advantages of this invention.

We claim:

1. A method of electrochemically filling cavities on a wafer surface to form a substantially planar conductive layer, comprising:
    applying a first cathodic current to form a first conductive layer on the wafer surface, the wafer having a first cavity and a second cavity, wherein the first cavity has the smallest width and the second cavity has a larger width than the first cavity, and wherein the first and the second cavities are less than 10 micrometers in width;
    treating a surface of the first conductive layer by applying a first anodic current waveform having a first number of pulses after applying the first cathodic current;
    applying a second cathodic current to form a second conductive layer on the first conductive layer after applying the first anodic current waveform; and
    treating a surface of the second conductive layer by applying a second anodic current waveform having a second number of pulses after applying the second cathodic current,
    wherein the second anodic current waveform has a longer duration than the first anodic current waveform and wherein the second number is greater than the first number.

2. The method of claim 1, wherein the step of treating the surface of the first conductive layer prevents bump formation on the surface of the first conductive layer.

3. The method of claim 1, wherein the steps of applying first and second cathodic currents comprise applying DC voltage.

4. The method of claim 1, wherein the steps of applying first and second cathodic currents comprise applying AC voltage.

5. The method of claim 1, further comprising repeating the steps of treating and applying until all the cavities on the wafer surface are filled.

6. A method to electrochemically fill a plurality of cavities on a wafer surface comprising:
    applying a first cathodic current to fill a first cavity and partially fill a second cavity with a first conductive layer on the wafer surface, the first cavity having a smaller width than the second cavity wherein the first cavity and the second cavity each include a width less than 10 micrometers;

applying a first anodic current waveform having a first number of pulses to treat the first conductive layer after applying the first cathodic current;

applying a second cathodic current to fill the second cavity with a second conductive layer to form a substantially planar conductive layer over the first cavity and the second cavity after applying the first anodic current waveform; and applying a second anodic current waveform having a second number of pulses to treat the second conductive layer after applying the second cathodic current, wherein the second anodic current waveform has a longer duration than the first anodic current waveform and wherein the second number is greater than the first number.

7. The method of claim 6, wherein applying the first cathodic current includes applying a cathodic DC waveform.

8. The method of claim 6, wherein applying the first cathodic current includes applying a cathodic AC waveform.

9. The method of claim 6, wherein the anodic current pulses are each approximately 1 second in duration.

10. A method of electrochemically filling cavities on a wafer surface to form a planar conductive layer, comprising:

providing a first cavity with a smallest width and a second cavity having a larger width than the first cavity, wherein the first and second cavities are less than 10 micrometers in width;

applying a first cathodic current waveform to form a first conductive layer on the wafer surface;

treating the first conductive layer by applying a first anodic current waveform having a first number of pulses after applying the first cathodic current;

applying a second cathodic current waveform to form a second conductive layer on the first conductive layer after applying the first anodic current waveform, the second conductive layer having a planar portion over the first cavity; and treating the second conductive layer by applying a second anodic current waveform having a second number of pulses after applying the second cathodic current, wherein the second cathodic current waveform has a longer duration than the first cathodic current waveform and the second anodic current waveform has a longer duration than the first anodic current waveform, and wherein the second number is greater than the first number.

11. The method of claim 10, wherein applying the first cathodic current includes applying a cathodic rectangular waveform.

12. The method of claim 10, wherein the planar conductive layer is copper.

13. The method of claim 1, wherein the step of applying the first cathodic current comprises forming the first conductive layer including a planar portion over the first cavity and a non-planar portion over the second cavity.

14. The method of claim 1, wherein the step of applying the second cathodic current comprises forming the second conductive layer including a planar portion over both the first and second cavities.

15. The method of claim 1, wherein the step of treating the surface of the second conductive layer prevents bump formation on the surface of the second conductive layer.

16. The method of claim 1, wherein the second cathodic current is applied for a longer time than the first cathodic current.

17. The method of claim 6, wherein applying the second cathodic current includes applying a cathodic DC waveform.

18. The method of claim 6, wherein applying the second cathodic current includes applying a cathodic AC waveform.

19. The method of claim 6, wherein the second cathodic current is applied for a longer time than the first cathodic current.

20. The method of claim 10, wherein the second cathodic current waveform is a cathodic rectangular waveform.

21. The method of claim 10, wherein the first anodic current waveform includes a plurality of anodic current pulses of approximately 1 second in duration.

22. The method of claim 10, wherein the second anodic current wavefonn includes a plurality of anodic current pulses of approximately 1 second in duration.

23. The method of claim 10, wherein applying the first cathodic current waveform comprises forming the first conductive layer including a planar portion over the first cavity and a non-planar portion over the second cavity.

24. The method of claim 23, wherein the first cavity is filled and the second cavity is unfilled.

* * * * *